United States Patent
Yuan et al.

(10) Patent No.: US 11,784,404 B2
(45) Date of Patent: Oct. 10, 2023

(54) STRUCTURE ROTATING ON A SHAFT ENABLING WIDER RANGE OF WIRELESS FREQUENCIES

(71) Applicants: Zhengzhou Wanmayun Electronic Technology CO., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

(72) Inventors: Bo-Duo Yuan, Shenzhen (CN); Liu-Jun Jiang, Shenzhen (CN)

(73) Assignees: Zhengzhou Wanmayun Electronic Technology CO., Ltd., Zhengzhou (CN); HONGFUJIN PRECISION ELECTRONICS (ZHENGZHOU) CO., LTD., Zhengzhou (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 17/691,259

(22) Filed: Mar. 10, 2022

(65) Prior Publication Data
US 2023/0238696 A1 Jul. 27, 2023

(30) Foreign Application Priority Data
Jan. 25, 2022 (CN) .......................... 202210087403.9

(51) Int. Cl.
*H01Q 3/04* (2006.01)
*H01Q 1/08* (2006.01)
*H05K 5/02* (2006.01)

(52) U.S. Cl.
CPC ............... *H01Q 3/04* (2013.01); *H01Q 1/084* (2013.01); *H01R 2201/02* (2013.01); *H05K 5/0278* (2013.01)

(58) Field of Classification Search
CPC .............................. H01Q 3/04; H01Q 1/2275
See application file for complete search history.

(56) References Cited

U.S. PATENT DOCUMENTS

| 6,758,689 B1* | 7/2004 | Bair | H01R 31/065 |
| | | | 343/702 |
| 7,530,823 B1* | 5/2009 | Thornton | H01Q 1/2275 |
| | | | 439/142 |
| 2005/0001775 A1* | 1/2005 | Liang | H01Q 1/38 |
| | | | 343/702 |
| 2009/0158062 A1* | 6/2009 | Delmotte | H01Q 1/08 |
| | | | 713/300 |
| 2019/0067811 A1* | 2/2019 | So | H01Q 1/273 |

FOREIGN PATENT DOCUMENTS

CN 203674372 U * 6/2014

* cited by examiner

*Primary Examiner* — Ab Salam Alkassim, Jr.
*Assistant Examiner* — Anh N Ho
(74) *Attorney, Agent, or Firm* — ScienBiziP, P.C.

(57) ABSTRACT

A structure containing an antenna with an orientation which can be changed when one part of a two-part structure is turned relative to the other on a rotating shaft includes first and second structures as the two parts. The second structure is rotatably connected to the first structure through the rotating shaft, and the second structure comprises an antenna plate. When the second structure is rotated relative to the first structure, the rotated antenna plate allows a wider range of wavelength frequencies within the rotation range of the second structure.

19 Claims, 6 Drawing Sheets

STRUCTURE ROTATING ON A SHAFT ENABLING WIDER RANGE OF WIRELESS FREQUENCIES

The subject matter herein generally relates to a rotating shaft structure.

BACKGROUND

In various fields and daily life, a structure rotating on a shaft is widely used, such as manipulator, bicycle, bracket, and so on. For all kinds of newly developed products with special structure, the application requirements of the rotating shaft structure are different. A rotation angle and other functions of a traditional rotating shaft structure do not meet the needs of new products. However, redesigning a special rotating shaft structure has high cost and long cycle. Therefore, it is necessary to further improve the usability of the rotating shaft structure in various products and expand the functionality of the rotating shaft structure.

Therefore, improvement is desired.

BRIEF DESCRIPTION OF THE DRAWINGS

Implementations of the present disclosure will now be described, by way of embodiments, with reference to the attached figures.

DETAILED DESCRIPTION

Figure 1A:
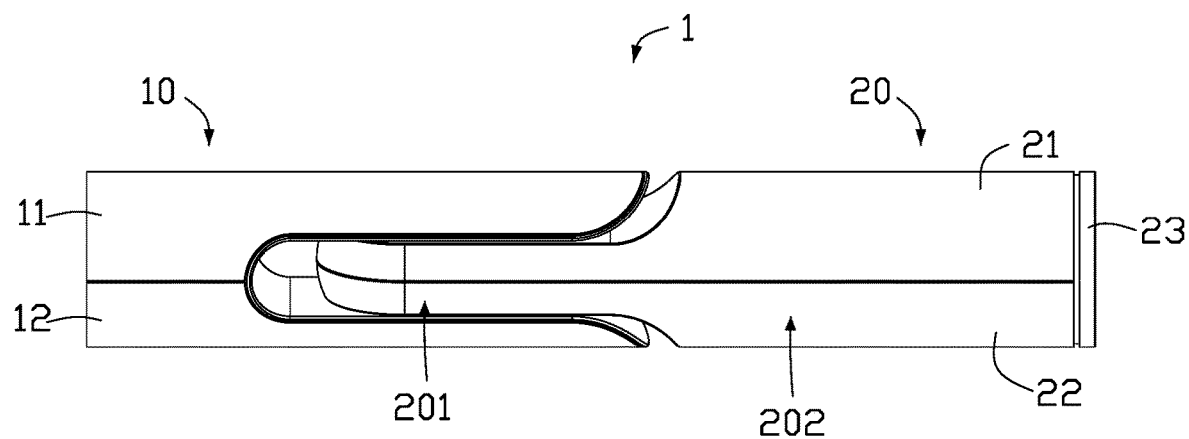
FIGS. 1A and 1B are schematic diagrams of an embodiment of a rotating shaft structure according to the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

The rotating shaft structure 1 of the embodiment of the present disclosure has a simple and attractive appearance and convenience of assembly. The rotating shaft structure 1 is suitable for a variety of uses (for example, in base stations and various electronic products) and has a variety of forms in which it can be installed. An antenna can be installed inside the rotating shaft structure 1. Rotation of the rotating shaft structure will enable the antenna to have a wider range of signal reception and transmission.

Figure 1B:
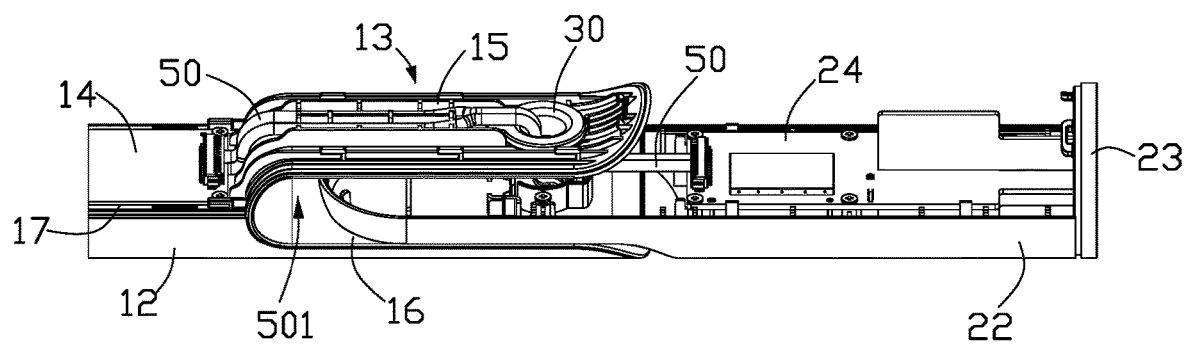

FIGS. 1A and 1B illustrate a structure on a rotating shaft (rotating shaft structure 1) in accordance with an embodiment of the present disclosure.

The rotating shaft structure 1 includes a first structure 10, a second structure 20, and a rotating shaft 30. The first structure 10 and the second structure 20 are connected in series through the rotating shaft 30, and can rotate relative to each other on the rotating shaft 30.

In some embodiments, the rotation movement of the second structure 20 relative to the first structure 10 can range from 0° to 240°.

The first structure 10 includes a first decorative cover 11, a second decorative cover 12, a support assembly 13, and a circuit board 14. In profile, the support assembly 13 resembles the prongs of a fork. The support assembly 13 includes a first support plate 15, a second support plate 16 and a third support plate 17. A receiving slot 501 is defined between the first support plate 15 and the second support plate 16. One end of the first support plate 15 and one end of the second support plate 16 are connected to the third support plate 17.

The first decorative cover 11, the second decorative cover 12, the first support plate 15, the second support plate 16, and the third support plate 17 can be provided with a snap-together assembly (not shown in the figure). In some embodiment, the first decorative cover 11 can be assembled and fixed on the side of the first support plate 15 and the third support plate 17 close to the first support plate first support plate 15 through the snap-together assembly. The first decorative cover 11 can be assembled and fixed on the side of the first support plate 15 and the third support plate 17 close to the first support plate 15 by the snap-together assembly. The circuit board 14 is assembled and fixed on the side of the third support plate 17 close to the first support plate 15 by fasteners such as screws.

Figure 2A:
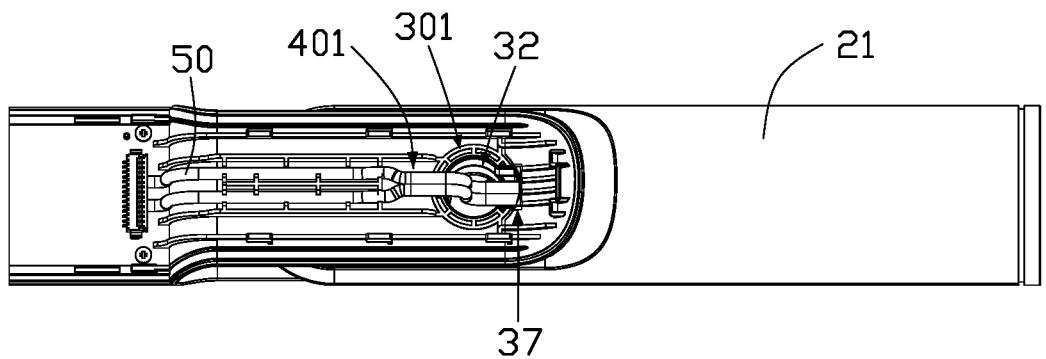
FIGS. 2A and 2B are schematic diagrams of an embodiment of the rotating shaft structure in another state according to the present disclosure.
Figure 2B:
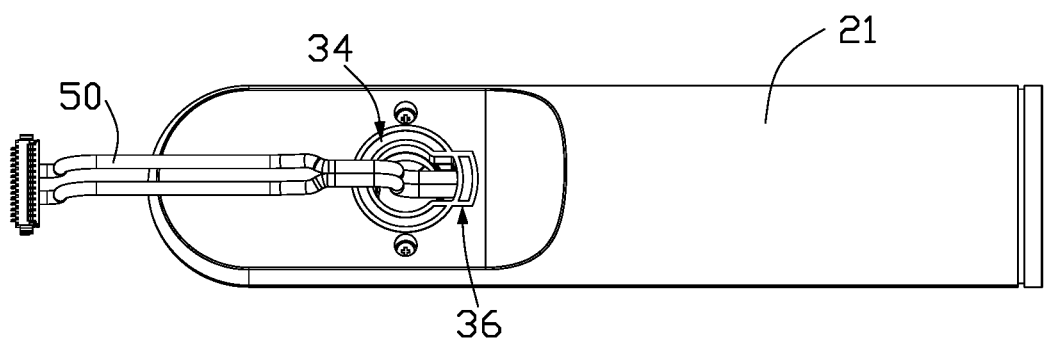
Figure 4:
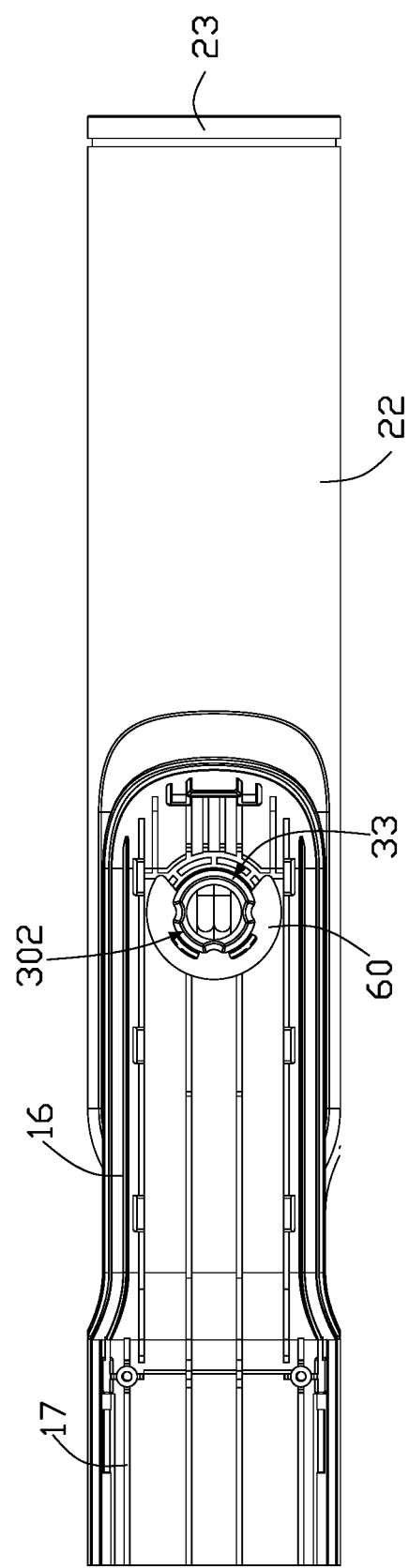
FIG. 4 is a schematic diagram of an embodiment of the rotating shaft structure in another state according to the present disclosure.

As shown in FIGS. 2A and 2B, the first support plate 15 is provided with a first shaft hole 32, and the second support plate 16 is provided with a second shaft hole 33 (shown in FIG. 4). The first shaft hole 32 is arranged parallel to the second shaft hole 33, so that the rotating shaft 30 can pass through the first support plate 15 and the second support plate 16 through the first shaft hole 32 and the second shaft hole 33.

As shown in FIGS. 1A and 1B, the second structure 20 includes a first cover plate 21, a second cover plate 22, a third cover plate 23, and an antenna plate 24. The antenna plate 24 is mounted and fixed to the inner side of the second cover plate 22 by a mounting assembly (such as a screw). The first cover plate 21, the second cover plate 22 and the third cover plate 23 are all provided with snap-together assemblies (not shown in the figures). The first cover plate 21 is assembled and fixed with the second cover plate 22 through the snap-together assembly. The third cover plate 23 is assembled and fixed on the first cover plate 21 and the second cover plate 22 through the snap-together assembly.

In some embodiment, the second structure 20 includes a first end portion 201 and a second end portion 202. The size of the first end portion 201 is smaller than the size of the second end portion 202, and the first end portion 201 forms a depression relative to the second end portion 202. The first end portion 201 of the second structure 20 may be embedded in the receiving slot 501 between the first support plate 15 and the second support plate 16. The antenna plate 24 is mounted on the second end portion 202 of the second structure 20 close to the inner side of the second cover plate 22. The third cover plate 23 is arranged on the second end portion 202 of the second structure 20.

Figure 3:
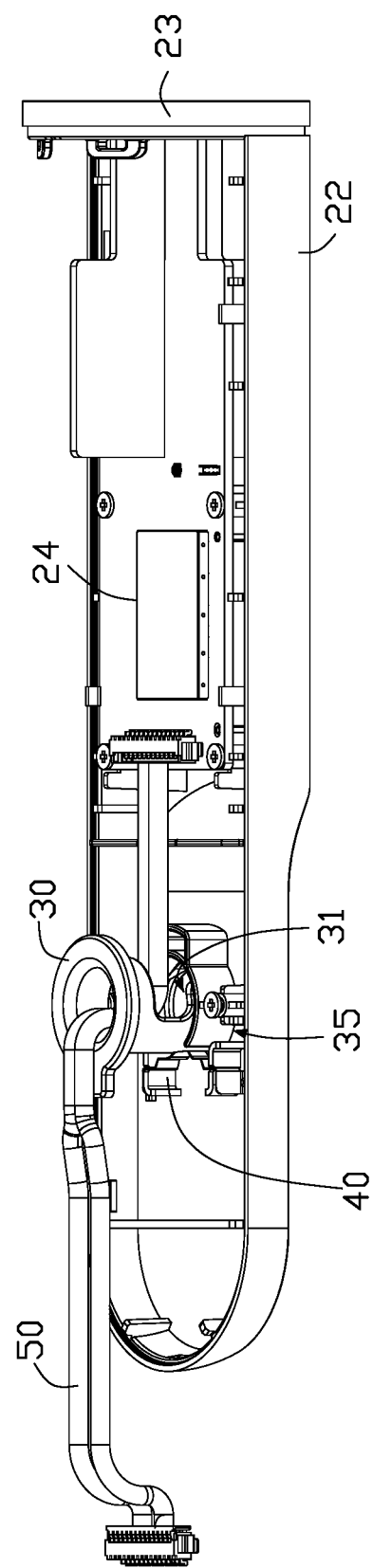
FIG. 3 is a schematic diagram of an embodiment of a second structure according to the present disclosure.

As shown in FIGS. 2A and 2B, the first cover plate 21 defines a third shaft hole 34, and the second cover plate 22 defines a fourth shaft hole 35 (shown in FIG. 3). The third shaft hole 34 is arranged approximately parallel to the fourth shaft hole 35, so that the rotating shaft 30 can pass through the first cover plate 21 and the second cover plate 22, through the third shaft hole 34 and the fourth shaft hole 35.

In some embodiment. the rotating shaft 30 passes through the first shaft hole 32, the third shaft hole 34, the fourth shaft hole 35, and the second shaft hole 33 in turn, and the rotating shaft 30 passes through the first support plate 15, the first cover plate 21, the second cover plate 22 and the second support plate 16 in turn to connect the first support plate 15, the first cover plate 21, the second cover plate 22, and the second support plate 16 in series.

Referring to FIG. 4, a first end of the rotating shaft 30 is provided with a snap-ring structure 301 (shown in FIG. 2A), and then the first end of the rotating shaft 30 can be snapped onto the first support plate 15 through the snap-ring structure 301. A second end of the rotating shaft 30 is provided with a snap-ring groove 302. When the rotating shaft 30 connects the first support plate 15, the first cover plate 21, the second cover plate 22, and the second support plate 16 in series, snap-ring 60 can be used to snap onto the snap ring groove 302 to fix the second end of the rotating shaft 30 to the second support plate 16, so that the rotating shaft 30 is fixed in the support assembly 13.

As shown in FIG. 3, in the second cover plate 22, a positioning shrapnel 40 is installed next to the fourth shaft hole 35. When the rotating shaft 30 is installed in the second cover plate 22, the positioning shrapnel 40 is close to the rotating shaft 30 through its own elastic force. The positioning shrapnel 40 is used to make the structure between the second cover plate 22 and the rotating shaft 30 less loose and more stable, but the second cover plate 22 can still rotate around the rotating shaft 30.

As shown in FIGS. 1A and 1B, after the first cover plate 21 and the second cover plate 22 are assembled and fixed, they are embedded between the first support plate 15 and the second support plate 16, and then the first support plate 15, the first cover plate 21, the second cover plate 22 and the second support plate 16 are connected in series through the rotating shaft 30. The first cover plate 21 and the second cover plate 22 can rotate relative to the first support plate 15 and the second support plate 16 with the rotating shaft 30 as the axis. The second structure 20 can also rotate relative to the support assembly 13 on the axis of the rotating shaft 30.

In some embodiment, the rotating shaft structure 1 may include a variety of installation forms. The installation forms can include side installation form and vertical installation form.

Figure 5A:
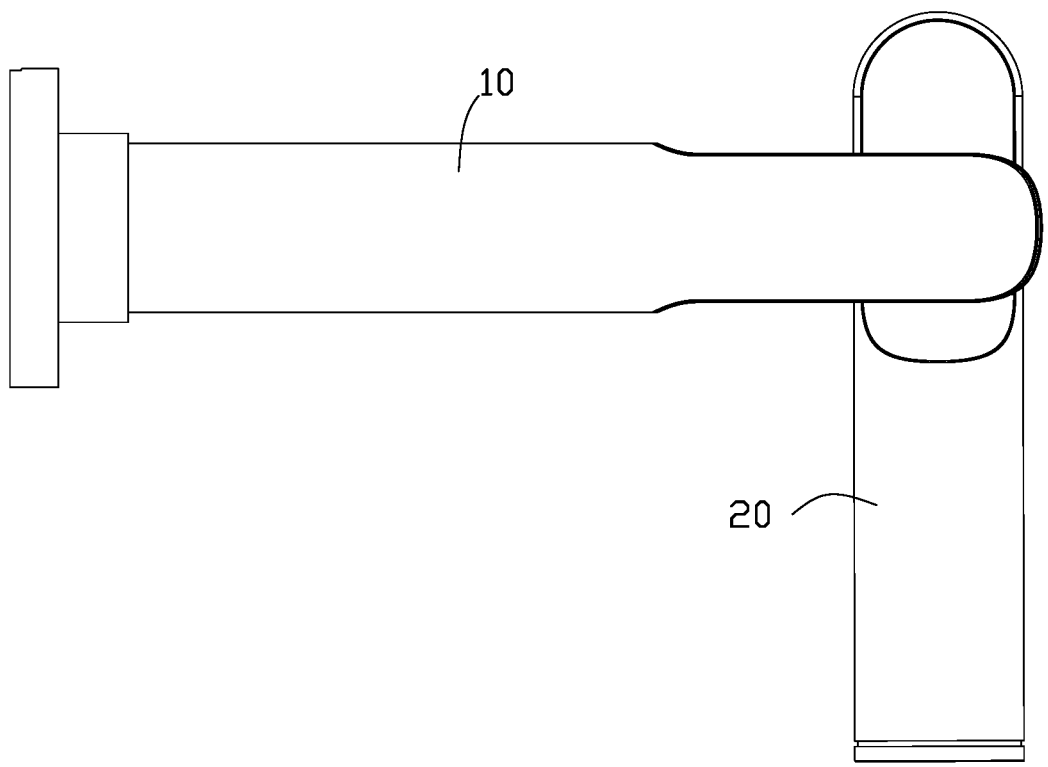
FIGS. 5A and 5B are schematic diagrams of an embodiment of an installation form of the rotating shaft structure according to the present disclosure.
Figure 5B:
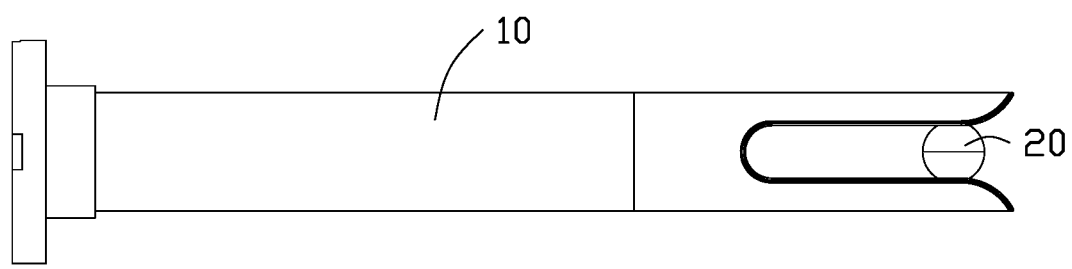
Figure 6A:
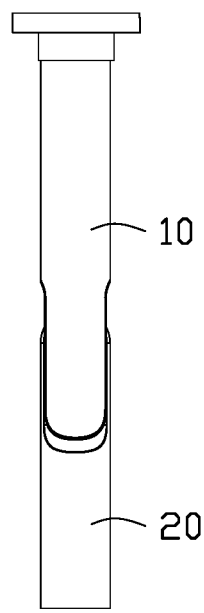
FIGS. 6A and 6B are schematic diagrams of an embodiment of another installation form of the rotating shaft structure according to the present disclosure.
Figure 6B:
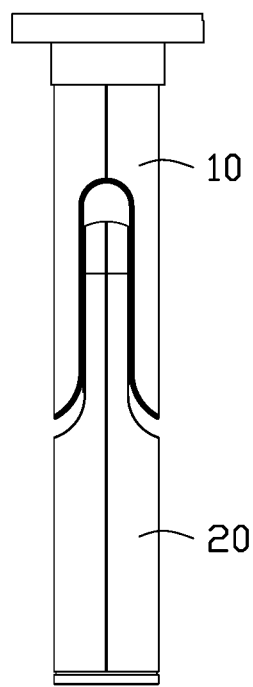

FIGS. 5A and 5B show the installation form of the rotating shaft structure 1 on the side. FIG. 5A is a front view of the rotating shaft structure 1 installed in the side installation form. FIG. 5B is a top view of the rotating shaft structure 1 installed in the side installation form. FIGS. 6A and 6B show the schematic diagram of the vertical installation form of the rotating shaft structure 1. FIG. 6A is a front view of the rotating shaft structure 1 installed in the vertical installation form. FIG. 6B is a top view of the rotating shaft structure 1 installed in the vertical installation form. When the rotating shaft structure 1 is installed on the mounting carrier, one end of the first structure 10 is fixed on the mounting carrier, and the second structure 20 can rotate through an angle according to demand within the rotatable angle range.

The circuit board 14 is connected with the antenna plate 24 through a connecting line 50. The circuit board 14 supplies electric energy to the antenna plate 24 through the connecting line 50.

As shown in FIG. 1B and FIG. 3, the rotating shaft 30 is a hollow structure, and the rotating shaft 30 defines a notch 31. The connecting line 50 can extend from the antenna plate 24, pass through the notch 31, pass through the hollow structure of the rotating shaft 30, pass through the third shaft hole 34 and the first shaft hole 32, and pass through the first support plate 15, and then connect to the circuit board 14.

As shown in FIG. 2A and FIG. 2B, the third shaft hole 34 defines a first slot 36, the first slot 36 allows space for placing the connecting line 50 and prevents the connecting line 50 from being chafed and squeezed when passing through the third shaft hole 34. The first shaft hole 32 defines a second slot 37, the second slot 37 allows space for placing the connecting line 50 and prevents the connecting line 50 from being crushed when passing through the fourth shaft hole 35. The first support plate 15 also defines a receiving groove 401, the receiving groove 401 is used to receive and place the connecting line 50, so that the connecting line 50 can be neatly arranged on the first support plate 15.

In some embodiment, as shown in FIG. 1A and FIG. 1B, when the second structure 20 rotates, the second structure 20 drives the antenna plate 24 installed in the second cover plate 22 to rotate, and the range of signals received and transmitted by the antenna plate 24 can cover the rotatable range of the second structure 20. When the rotating shaft structure 1 is connected to the electronic product, the rotation of the rotating shaft structure 1 drives the antenna plate 24 to rotate, and the wavelength range of the antenna plate 24 is wider, and the wireless performance of the electronic product is strengthened.

The rotating shaft structure 1 of the embodiment of the present disclosure can be composed of two parts, and the two parts can be connected in series by a rotating shaft, and relative rotational motion can take place. The rotating shaft structure 1 is suitable for a variety of use forms and has a variety of installation forms, which can meet a variety of installation requirements. An antenna is also installed inside the rotating shaft structure 1. The rotation of the rotating shaft structure 1 drives the antenna to rotate, so that the antenna provides a wider range of wavelengths.

Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the exemplary embodiments described above may be modified within the scope of the claims.

What is claimed is:

1. A rotating shaft structure comprising:
    a rotating shaft;
    a first structure; and
    a second structure rotatably connected to the first structure through the rotating shaft; wherein the second structure comprises an antenna plate; and
        wherein when the second structure rotates relative to the first structure, a range of signal reception and radiation by the antenna plate covers a rotation range of the second structure;
        wherein the first structure comprises a support assembly, the support assembly comprises a first support plate, a second support plate and a third support plate;
        wherein the first structure comprises a first decorative cover and a second decorative cover, the first decorative cover is assembled on the first support plate and the third support plate close to the first support plate; the second decorative cover is assembled on the second support plate and the third support plate close to the second support plate.

2. The rotating shaft structure according to claim 1, wherein a receiving slot is defined between the first support plate and the second support plate; an end of the first support plate and an end of the second support plate are connected to the third support plate.

3. The rotating shaft structure according to claim 2, wherein the first structure further comprises a circuit board, the circuit board is assembled on the third support plate close to the first support plate through a mounting assembly.

4. The rotating shaft structure according to claim 3, wherein the first support plate defines a first shaft hole, the second support plate defines a second shaft hole, the first shaft hole is arranged parallel to the second shaft hole, and the rotating shaft passes through the first shaft hole and the second shaft hole to connect the first support plate and the second support plate.

5. The rotating shaft structure according to claim 4, wherein the second structure comprises a first cover plate, a second cover plate and a third cover plate, the antenna plate is installed on an inner side of the second cover plate through another mounting assembly; the first cover plate is assembled and fixed with the second cover plate; the third cover plate is assembled on the first cover plate and the second cover plate.

6. The rotating shaft structure according to claim 5, wherein the second structure comprises a first end portion and a second end portion; a size of the first end portion is smaller than a size of the second end portion, the first end portion is embedded in the receiving slot between the first support plate and the second support plate; the third cover plate is arranged on the second end portion of the second structure.

7. The rotating shaft structure according to claim 6, wherein the first cover plate defines a third shaft hole, the second cover plate defines a fourth shaft hole; the third shaft hole is relatively parallel to the fourth shaft hole, and the rotating shaft passes through the third shaft hole and the fourth shaft hole to connect the first cover plate and the second cover plate.

8. The rotating shaft structure according to claim 7, wherein the rotating shaft passes through the first shaft hole, the third shaft hole, the fourth shaft hole and the second shaft hole in turn, to connect the first support plate, the first cover plate, the second cover plate and the second support plate; a first end of the rotating shaft is provided with a snap ring structure, and the first end of the rotating shaft is clamped on the first support plate through the snap ring structure, a second end of the rotating shaft is provided with a snap ring groove, the rotating shaft structure further comprises a snap ring, the snap ring is buckled on the snap ring groove to fix the second end of the rotating shaft and the second support plate, and the rotating shaft is fixed in the support assembly.

9. The rotating shaft structure according to claim 8, wherein a positioning shrapnel is installed beside the fourth shaft hole; when the rotating shaft is installed in the second cover plate, the positioning shrapnel is close to the rotating shaft through elastic force; the positioning shrapnel is configured for fastening the second cover plate and the rotating shaft.

10. The rotating shaft structure according to claim 9, wherein the circuit board is electrically connected to the antenna plate through a connecting line, and the circuit board is configured to provide electric energy for the antenna plate, the rotating shaft is a hollow structure, and the rotating shaft defines a notch, the connecting line extends from the antenna plate, passes through the notch, passes through the hollow structure of the rotating shaft, passes through the third shaft hole and the first shaft hole, and passes through the first support plate, and is connected to the circuit board; the third shaft hole defines a first slot, and the first slot is configured to receive the connecting line; the first shaft hole defines a second slot, and the second slot is configured to place the connecting line, the first support plate defines a receiving groove, the receiving groove is configured to receive the connecting line.

11. A rotating shaft structure comprising:
    a rotating shaft;
    a first structure; and
    a second structure rotatably connected to the first structure through the rotating shaft; wherein the second structure comprises an antenna plate; and
        wherein when the second structure rotates relative to the first structure, a range of signal reception and radiation by the antenna plate covers a rotation range of the second structure; and
        wherein the first structure comprises a support assembly, the support assembly comprises a first support plate and a second support plate, the first support plate defines a first shaft hole, the second support plate defines a second shaft hole, the first shaft hole is arranged parallel to the second shaft hole, and the rotating shaft passes through the first shaft hole and the second shaft hole to connect the first support plate and the second support plate;
        wherein the support assembly further comprises a third support plate;
        wherein the first structure comprises a first decorative cover and a second decorative cover, the first decorative cover is assembled on the first support plate and the third support plate close to the first support plate; the second decorative cover is assembled on the second support plate and the third support plate close to the second support plate.

12. The rotating shaft structure according to claim 11, wherein a receiving slot is defined between the first support plate and the second support plate; an end of the first support plate and an end of the second support plate are connected to the third support plate.

13. The rotating shaft structure according to claim 12, wherein the first structure further comprises a circuit board, the circuit board is assembled on the third support plate close to the first support plate through a mounting assembly.

14. The rotating shaft structure according to claim 13, wherein the second structure comprises a first cover plate, a second cover plate and a third cover plate, the antenna plate is installed on an inner side of the second cover plate through another mounting assembly; the first cover plate is assembled and fixed with the second cover plate; the third cover plate is assembled on the first cover plate and the second cover plate.

15. The rotating shaft structure according to claim 14, wherein the second structure comprises a first end portion and a second end portion; a size of the first end portion is smaller than a size of the second end portion, the first end portion is embedded in the receiving slot between the first support plate and the second support plate; the third cover plate is arranged on the second end portion of the second structure.

16. The rotating shaft structure according to claim 15, wherein the first cover plate defines a third shaft hole, the second cover plate defines a fourth shaft hole; the third shaft hole is relatively parallel to the fourth shaft hole, and the rotating shaft passes through the third shaft hole and the fourth shaft hole to connect the first cover plate and the second cover plate.

17. The rotating shaft structure according to claim 16, wherein the rotating shaft passes through the first shaft hole, the third shaft hole, the fourth shaft hole and the second shaft hole in turn, to connect the first support plate, the first cover plate, the second cover plate and the second support plate; a first end of the rotating shaft is provided with a snap ring structure, and the first end of the rotating shaft is clamped on the first support plate through the snap ring structure, a second end of the rotating shaft is provided with a snap ring groove, the rotating shaft structure further comprises a snap ring, the snap ring is buckled on the snap ring groove to fix the second end of the rotating shaft and the second support plate, and the rotating shaft is fixed in the support assembly.

18. The rotating shaft structure according to claim 17, wherein a positioning shrapnel is installed beside the fourth shaft hole; when the rotating shaft is installed in the second cover plate, the positioning shrapnel is close to the rotating shaft through elastic force; the positioning shrapnel is configured for fastening the second cover plate and the rotating shaft.

19. The rotating shaft structure according to claim 18, wherein the circuit board is electrically connected to the antenna plate through a connecting line, and the circuit board is configured to provide electric energy for the antenna plate, the rotating shaft is a hollow structure, and the rotating shaft defines a notch, the connecting line extends from the antenna plate, passes through the notch, passes through the hollow structure of the rotating shaft, passes through the third shaft hole and the first shaft hole, and passes through the first support plate, and is connected to the circuit board; the third shaft hole defines a first slot, and the first slot is configured to receive the connecting line; the first shaft hole defines a second slot, and the second slot is configured to place the connecting line, the first support plate defines a receiving groove, the receiving groove is configured to receive the connecting line.

\* \* \* \* \*